United States Patent
Kim et al.

(10) Patent No.: US 10,777,702 B2
(45) Date of Patent: Sep. 15, 2020

(54) METHOD AND APPARATUS FOR REDUCTION OF LIGHT INDUCED DEGRADATION WITH CARRIER INJECTION

(71) Applicant: GUMI ELECTRONICS & INFORMATION TECHNOLOGY RESEARCH INSTITUTE, Gumi-si, Gyeongsangbuk-do (KR)

(72) Inventors: Jun Hee Kim, Gumi-si (KR); Soo Min Kim, Gumi-si (KR); Sang Hoon Jung, Gumi-si (KR); Sam Soo Kim, Gumi-si (KR); Gyu Seok Choi, Gumi-si (KR)

(73) Assignee: GUMI ELECTRONICS & INFORMATION TECHNOLOGY RESEARCH INSTITUTE, Gumi-si (KR)

( * ) Notice: Subject to any disclaimer, the term of this patent is extended or adjusted under 35 U.S.C. 154(b) by 0 days.

(21) Appl. No.: 16/586,277

(22) Filed: Sep. 27, 2019

(65) Prior Publication Data
US 2020/0176630 A1 Jun. 4, 2020

(30) Foreign Application Priority Data
Nov. 29, 2018 (KR) .......................... 10-2018-0151281

(51) Int. Cl.
| | |
|---|---|
| *H01L 21/00* | (2006.01) |
| *H01L 31/18* | (2006.01) |
| *H05B 3/00* | (2006.01) |
| *H02S 50/10* | (2014.01) |

(52) U.S. Cl.
CPC .......... *H01L 31/1864* (2013.01); *H02S 50/10* (2014.12); *H05B 3/0047* (2013.01)

(58) Field of Classification Search
USPC ........................................ 438/800
See application file for complete search history.

(56) References Cited

U.S. PATENT DOCUMENTS

| | | | | | |
|---|---|---|---|---|---|
| 4,596,645 | A | * | 6/1986 | Stirn ................... | C23C 14/0629 136/260 |
| 5,371,380 | A | * | 12/1994 | Saito ................... | H01L 29/1604 136/258 |
| 6,177,711 | B1 | * | 1/2001 | Kariya ................ | H01L 31/0236 257/458 |

(Continued)

*Primary Examiner* — Caleb E Henry
(74) *Attorney, Agent, or Firm* — Novick, Kim & Lee, PLLC; Jae Youn Kim; Jihun Kim

(57) ABSTRACT

Provided is an apparatus that can check in real time a process of removing light induced degradation using precise carrier injection through an AC power supply device (power unit). An apparatus for reduction of light induced degradation with carrier injection includes: a housing in which high-temperature heat treatment is performed on a solar battery cell; a heating unit that is formed in the housing, on which the solar battery cell is seated, and that heats the solar battery cell; a jig unit that is formed in the housing and fixes the solar battery cell to the heating unit by pressing the solar battery cell seated on the heating unit; an LED array unit that has a plurality of LED light sources and radiates light to the solar battery cell; and a driving unit that is coupled to the jig unit and the LED array unit and rotates the jig unit or the LED array unit.

8 Claims, 11 Drawing Sheets

(56) References Cited

U.S. PATENT DOCUMENTS

| | | | | |
|---|---|---|---|---|
| 6,252,158 B1* | 6/2001 | Higashikawa | ...... | H01L 31/0725 |
| | | | | 136/258 |
| 2001/0051388 A1* | 12/2001 | Shiozaki | ............ | H01L 21/0237 |
| | | | | 438/57 |
| 2002/0061632 A1* | 5/2002 | Ukiyo | ................... | C30B 19/062 |
| | | | | 438/479 |
| 2005/0040772 A1* | 2/2005 | Guzman | ............ | H05B 33/0842 |
| | | | | 315/291 |
| 2010/0294024 A1* | 11/2010 | Kumar | ................... | B82Y 20/00 |
| | | | | 73/38 |
| 2016/0111586 A1 | 4/2016 | Rey-Garcia et al. | | |
| 2017/0074894 A1* | 3/2017 | Minegishi | .............. | G01N 35/08 |

* cited by examiner

METHOD AND APPARATUS FOR REDUCTION OF LIGHT INDUCED DEGRADATION WITH CARRIER INJECTION

BACKGROUND OF THE INVENTION

Field of the Invention

The present invention relates to a method and apparatus for reduction of light induced degradation with carrier injection and, more particularly, to an apparatus that can check in real time a process of removing light induced degradation using precise carrier injection through an AC power supply device (power unit).

Description of the Related Art

Light induced degradation is a phenomenon of a change of the characteristics of specific substances or deterioration of the performance of specific devices due to the sunlight. Recently, research and development about sunlight energy is increasing, so removing the light induced degradation can be considered as the most important subject to developers of thin film solar batteries, and it is the main factor that interrupts activation in the relevant industrial field.

In the conventional process of removing light induced degradation, a treatment for removing light induced degradation is performed in a belt furnace that is used in a metallization of the process of manufacturing a solar battery, so the original function of the belt furnace is repeated. Accordingly, when an existing belt furnace to which the related art is not applied is installed, it is required to remove the existing belt furnace and install a new one, which causes a problem of duplicate investment.

Further, since a high-power light amount of 3~10 SUN is used in the related art, a high power source is required and a complicated equipment structure is necessarily required. Further, 0.1 SUN is an enough light amount to remove (regenerate) light induced degradation (Boron-Oxygen complex), so when a high-power light amount is used, uniformity of the light is difficult to maintain, so there is a problem in that it is difficult to control irradiance.

Next, when a high-power light source is used to remove the degradation, the anti-degradation state is initialized due to supply of excessive energy over the energy required to remove the light induced degradation, so both of a degradation removal process and the initializing process are continuously occurred. Accordingly, some degradation is initialized after the removal process, so there is a problem in that the performance of removing light induced degradation is deteriorated.

SUMMARY OF THE INVENTION

In order the solve the problems described above, an object of the present invention is to provide an apparatus for removing light induced degradation (LID) that is generated in crystalline silicon solar batteries doped with boron.

The objects to implement in the present invention are not limited to the technical problems described above and other objects that are not stated herein will be clearly understood by those skilled in the art from the following specifications.

In order to achieve the objects of the present invention, an apparatus for reduction of light induced degradation with carrier includes: a housing in which high-temperature heat treatment is performed on a solar battery cell; a heating unit that is formed in the housing, on which the solar battery cell is seated, and that heats the solar battery cell; a jig unit that is formed in the housing and fixes the solar battery cell to the heating unit by pressing the solar battery cell seated on the heating unit; an LED array unit that has a plurality of LED light sources and radiates light to the solar battery cell; and a driving unit that is coupled to the jig unit and the LED array unit and rotates the jig unit or the LED array unit.

In an embodiment of the present invention, the driving unit may move straight up and down the jig unit or the LED array unit.

In an embodiment of the present invention, the LED array unit may include: an LED array base in which the LED arrays are installed and arrayed; and a base connector having an end coupled to an LED array main body and the other end coupled to the driving unit to rotate.

In an embodiment of the present invention, the jig unit may include: a frame that presses the solar battery cell while being in contact with the solar battery cell; and a frame connector that has an end coupled to the frame and the other end coupled to the driving unit to rotate.

In an embodiment of the present invention, the apparatus may further include an air circulator that is coupled to a ceiling of the housing and discharges air in the housing.

In an embodiment of the present invention, the housing may have air holes formed through a bottom of the housing and providing channels for air that flows into the housing.

In an embodiment of the present invention, the apparatus may further include a power unit that applies a voltage to the solar battery cell, measures voltage reactivity of the solar battery cell, and supplies power to the LED light sources.

In an embodiment of the present invention, the jig unit may have a bus bar electrode which is an electrode that comes in contact with a top of the solar battery cell, and the heating unit may have a bottom contact electrode which is an electrode that comes in contact with a bottom of the solar battery.

In an embodiment of the present invention, the apparatus may further include a cooling unit that is connected with the LED array unit and cools the LED array unit in a water-cooling type.

A configuration of the present invention for achieving the object includes: i) a step in which the jig is rotated and the solar battery cell seated on the heating unit is fixed; ii) a step in which a heat treatment may be applied to the solar battery cell by heating by the heating unit to remove light induced degradation of the solar battery cell; iii) a step in which pre-annealing can be applied to the solar battery cell by heating by the heating unit and light is radiated to the solar battery cell by the LED light sources in order to perform a regeneration process for the solar battery cell; iv) a step in which light radiation to the solar battery cell by the LED light sources is stopped and a voltage is applied to the solar battery cell, whereby carrier injection is performed on the solar battery cell; and v) a step in which light is radiated to the solar battery cell from the LED light sources and whether light induced degradation has been removed from the solar battery cell is checked.

DETAILED DESCRIPTION OF THE PREFERRED EMBODIMENTS

Figure 1:
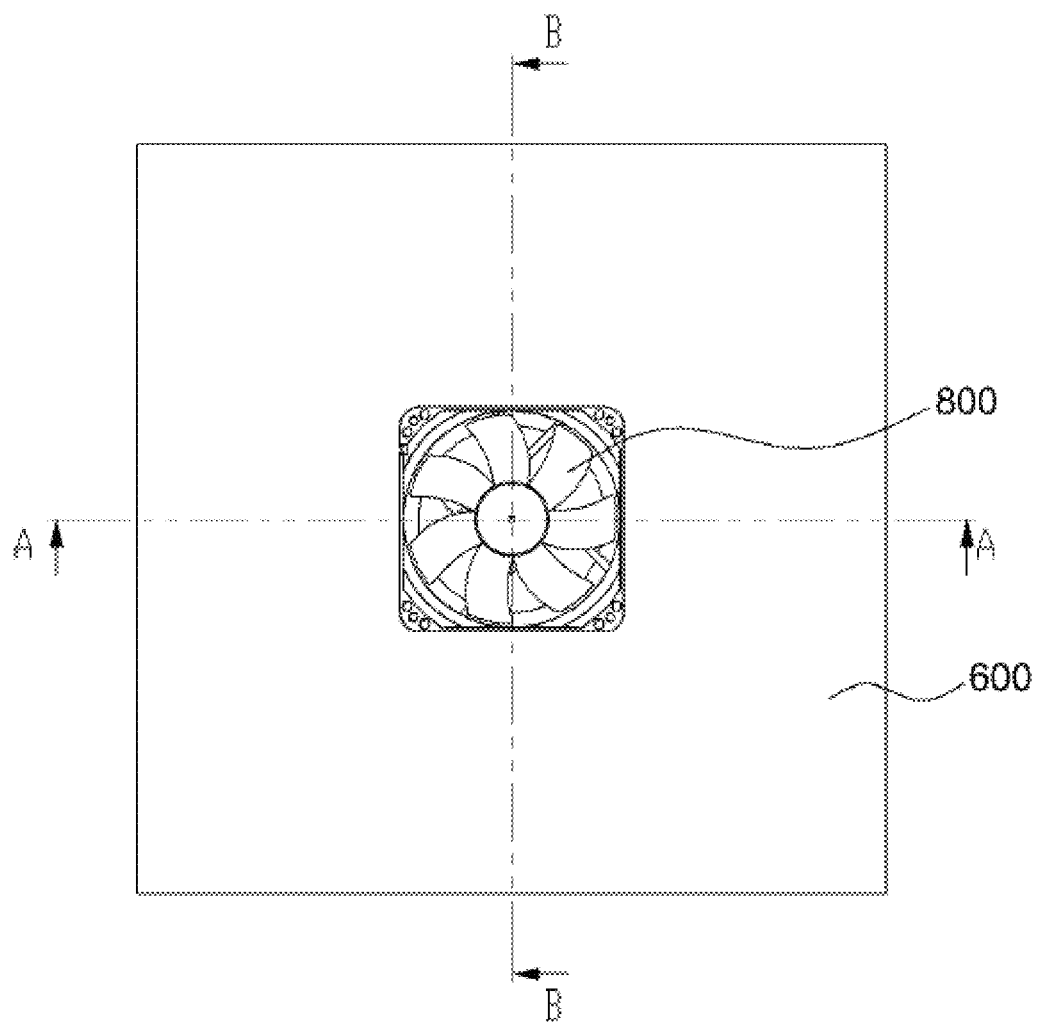
FIG. 1 is a plan view of an apparatus for reduction of light induced degradation according to an embodiment of the present invention.

Hereinafter, the present invention is described with reference to the accompanying drawings. However, the present invention may be modified in various different ways and is not limited to the embodiments described herein. Further, in the accompanying drawings, components irrelevant to the description will be omitted in order to obviously describe the present invention, and similar reference numerals will be used to describe similar components throughout the specification.

Throughout the specification, when an element is referred to as being "connected with (coupled to, combined with, in contact with)" another element, it may be "directly connected" to the other element and may also be "indirectly connected" to the other element with another element intervening therebetween. Further, unless explicitly described otherwise, "comprising" any components will be understood to imply the inclusion of other components rather than the exclusion of any other components.

The terminology used herein is for the purpose of describing particular embodiments only and is not intended to limit the present disclosure. Singular forms are intended to include plural forms unless the context clearly indicates otherwise. It will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

Hereinafter, the present invention is described in detail with reference to the accompanying drawings.

Figure 2:
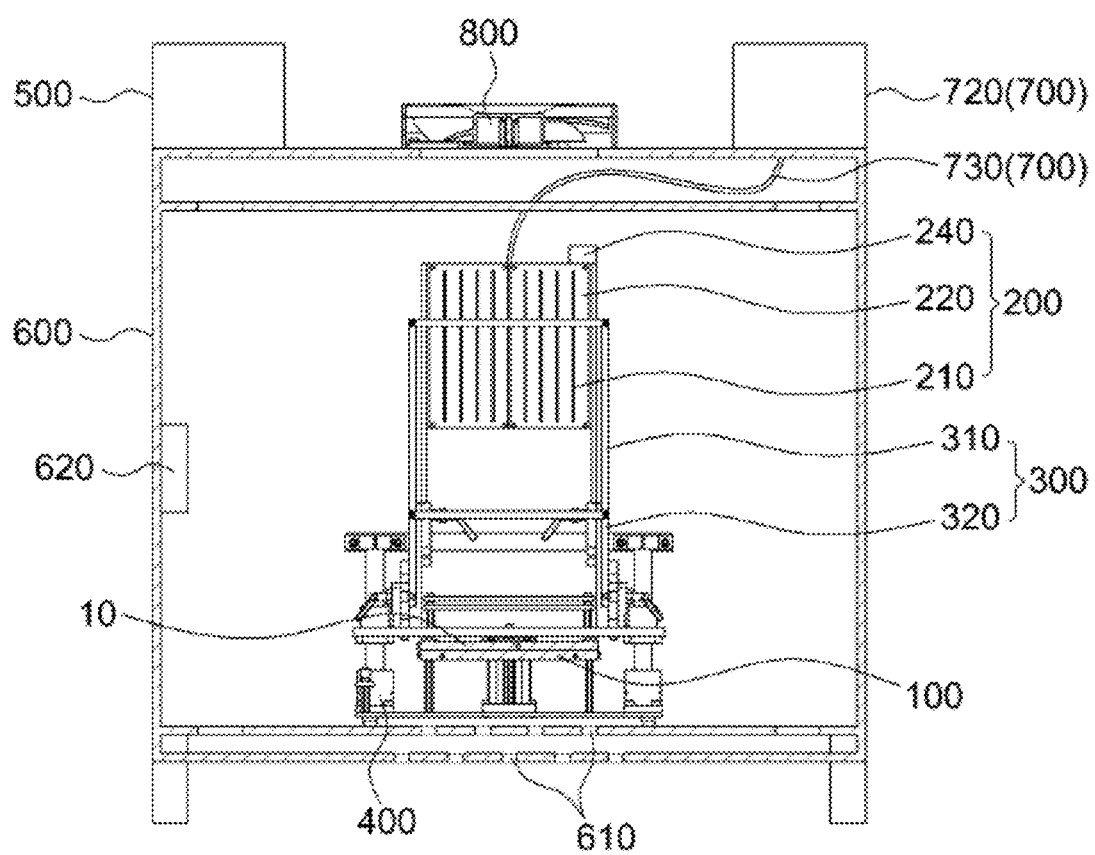
FIG. 2 is a front cross-sectional view when an LED array unit and a jig unit are positioned away from a solar battery cell in the apparatus for reduction of light induced degradation according to an embodiment of the present invention.
Figure 3:
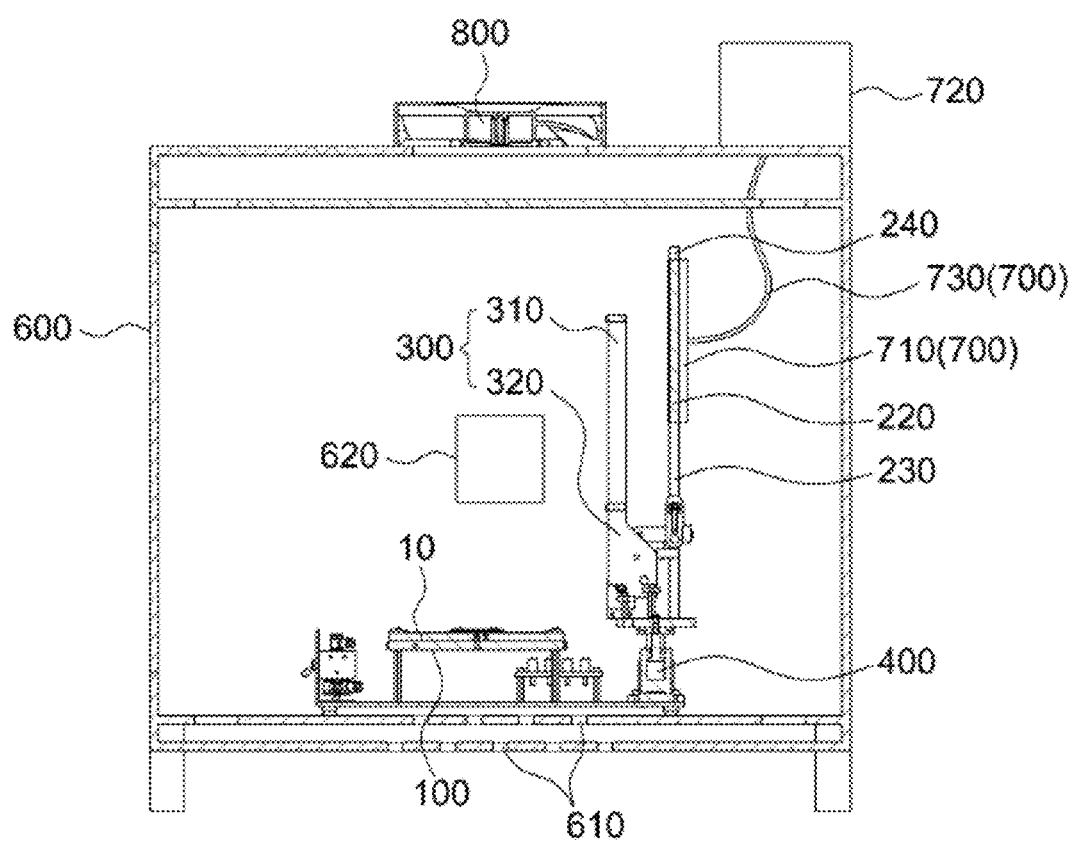
FIG. 3 is a side cross-sectional view when the LED array unit and the jig unit are positioned away from the solar battery cell in the apparatus for reduction of light induced degradation according to an embodiment of the present invention.

FIG. 1 is a plan view of an apparatus for reduction of light induced degradation according to an embodiment of the present invention, FIG. 2 is a front cross-sectional view when an LED array unit 200 and a jig unit 300 are positioned away from a solar battery cell 10 in the apparatus for reduction of light induced degradation according to an embodiment of the present invention, and FIG. 3 is a side cross-sectional view when an LED array unit 200 and a jig unit 300 are positioned away from a solar battery cell 10 in the apparatus for reduction of light induced degradation according to an embodiment of the present invention.

Figure 4:
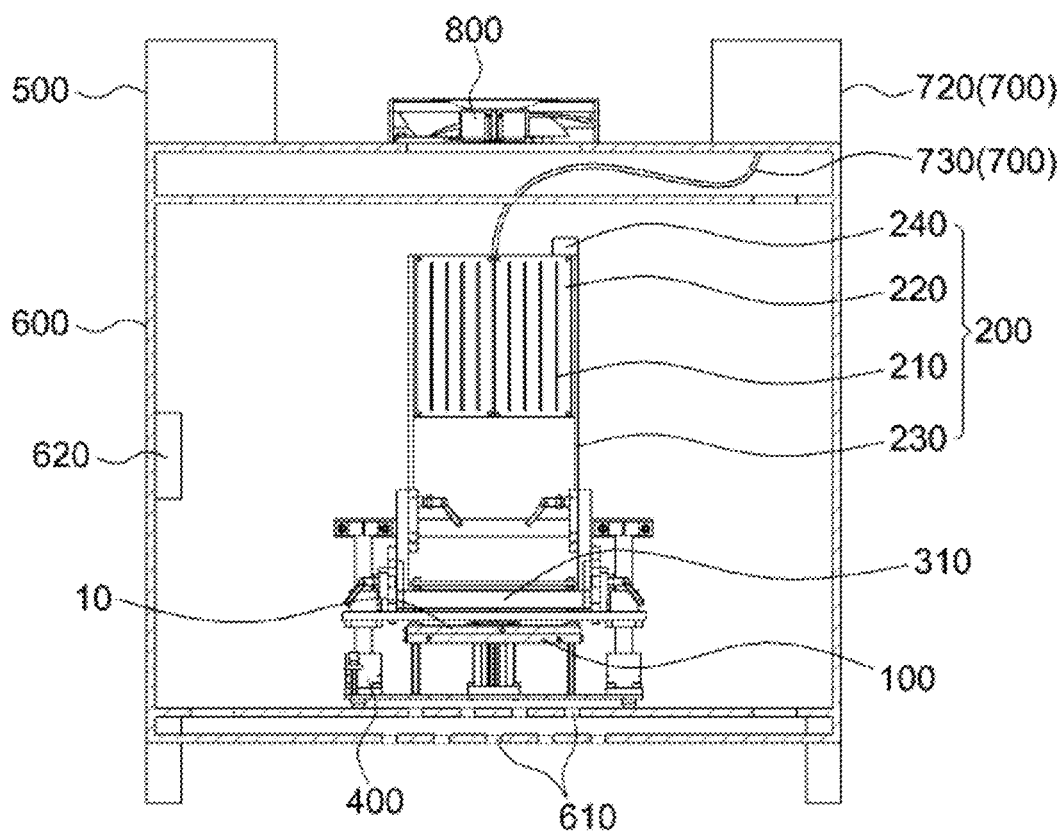
FIG. 4 is a front cross-sectional view when the jig unit that has been rotated is positioned close to the solar battery cell in the apparatus for reduction of light induced degradation according to an embodiment of the present invention.
Figure 5:
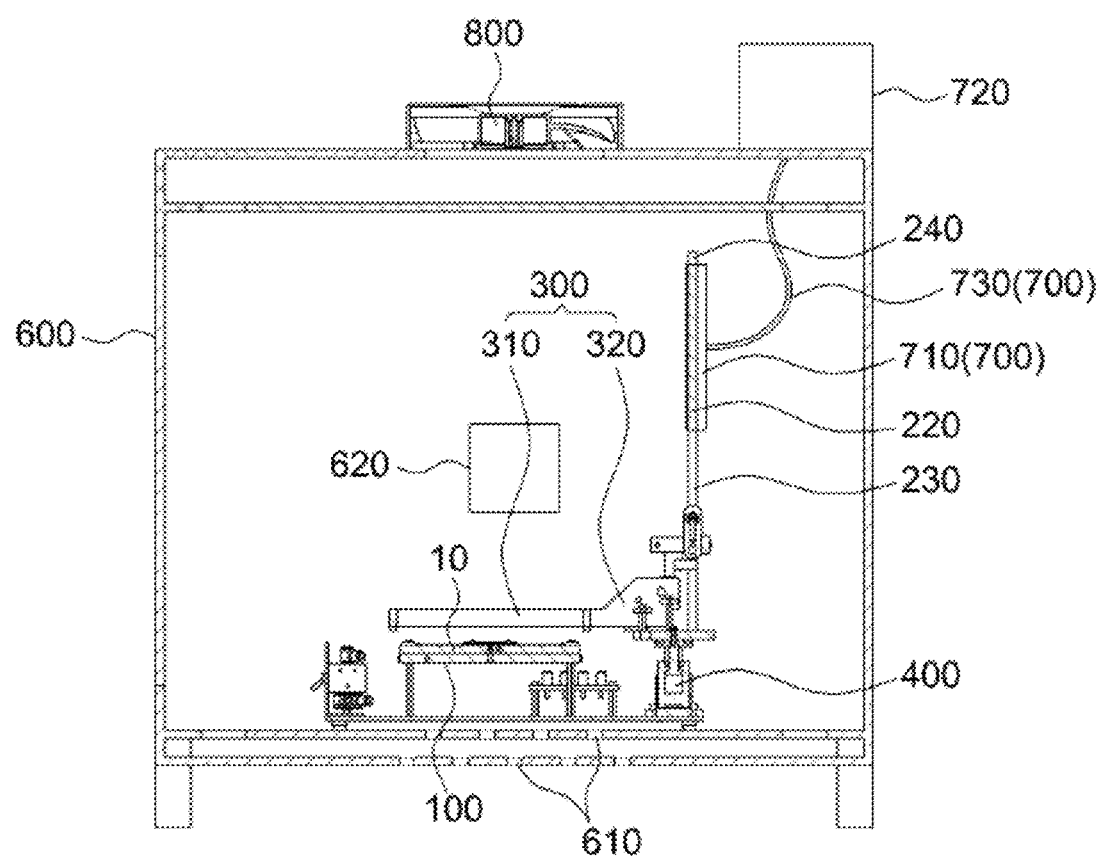
FIG. 5 is a front cross-sectional view when the jig unit that has been rotated is positioned close to the solar battery cell in the apparatus for reduction of light induced degradation according to an embodiment of the present invention.
Figure 6:
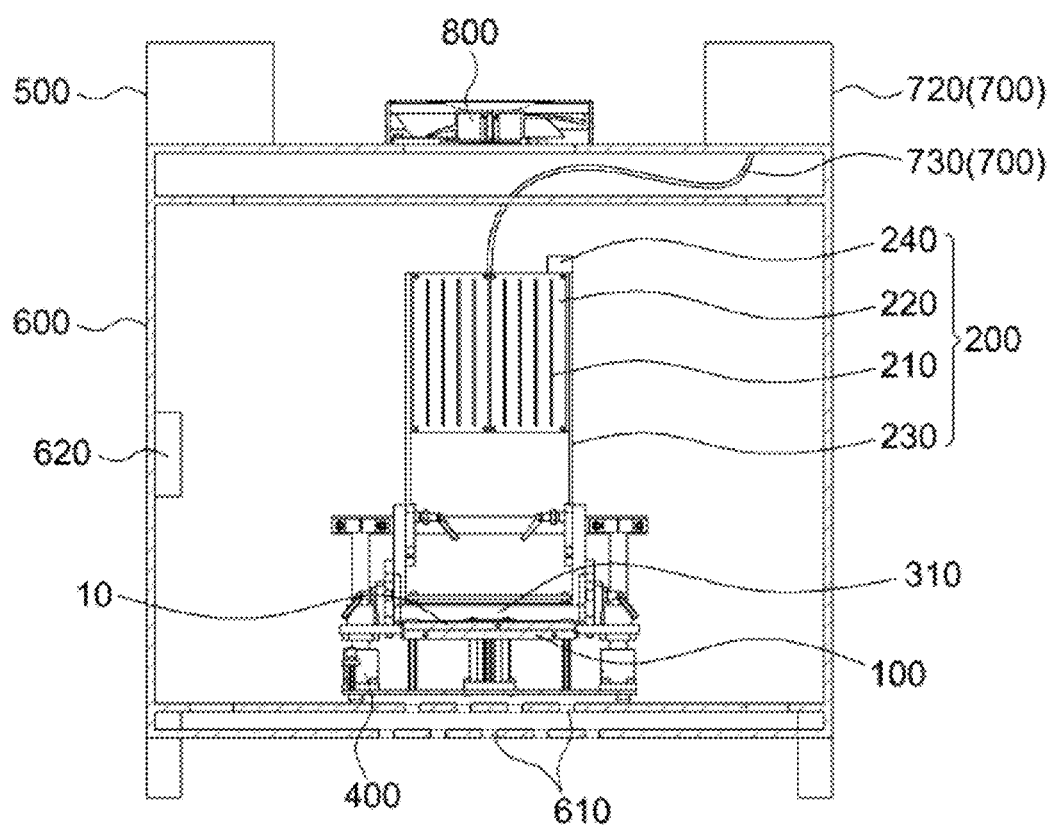
FIG. 6 is a front cross-sectional view when the jig unit presses the solar battery cell in the apparatus for reduction of light induced degradation according to an embodiment of the present invention.
Figure 7:
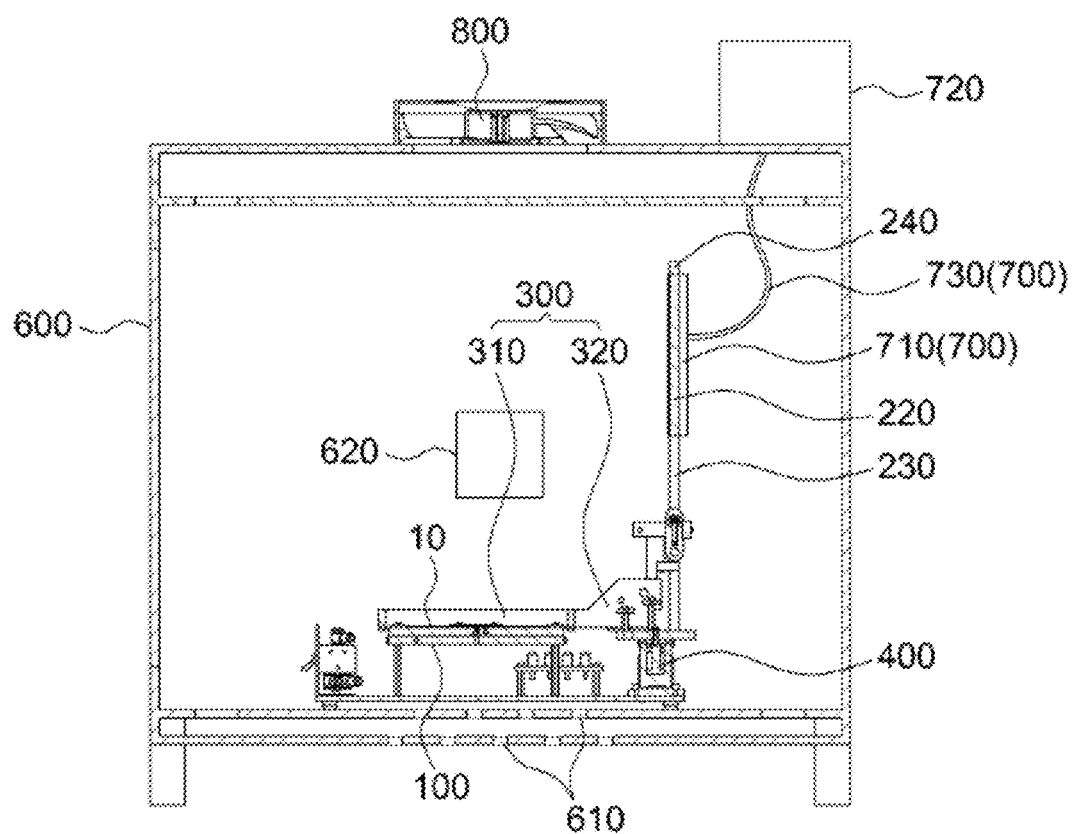
FIG. 7 is a side cross-sectional view when the jig unit presses the solar battery cell in the apparatus for reduction of light induced degradation according to an embodiment of the present invention.

FIG. 4 is a front cross-sectional view when the jig unit 300 that has been rotated is positioned close to the solar battery cell 10 in the apparatus for reduction of light induced degradation according to an embodiment of the present invention and FIG. 5 is a side cross-sectional view when the jig unit 300 that has been rotated is positioned close to the solar battery cell 10 in the apparatus for reduction of light induced degradation according to an embodiment of the present invention. FIG. 6 is a front cross-sectional view when the jig unit 300 presses the solar battery cell 10 in the apparatus for reduction of light induced degradation according to an embodiment of the present invention and FIG. 7 is a side cross-sectional view when the jig unit 300 presses the solar battery cell 10 in the apparatus for reduction of light induced degradation according to an embodiment of the present invention.

Figure 8:
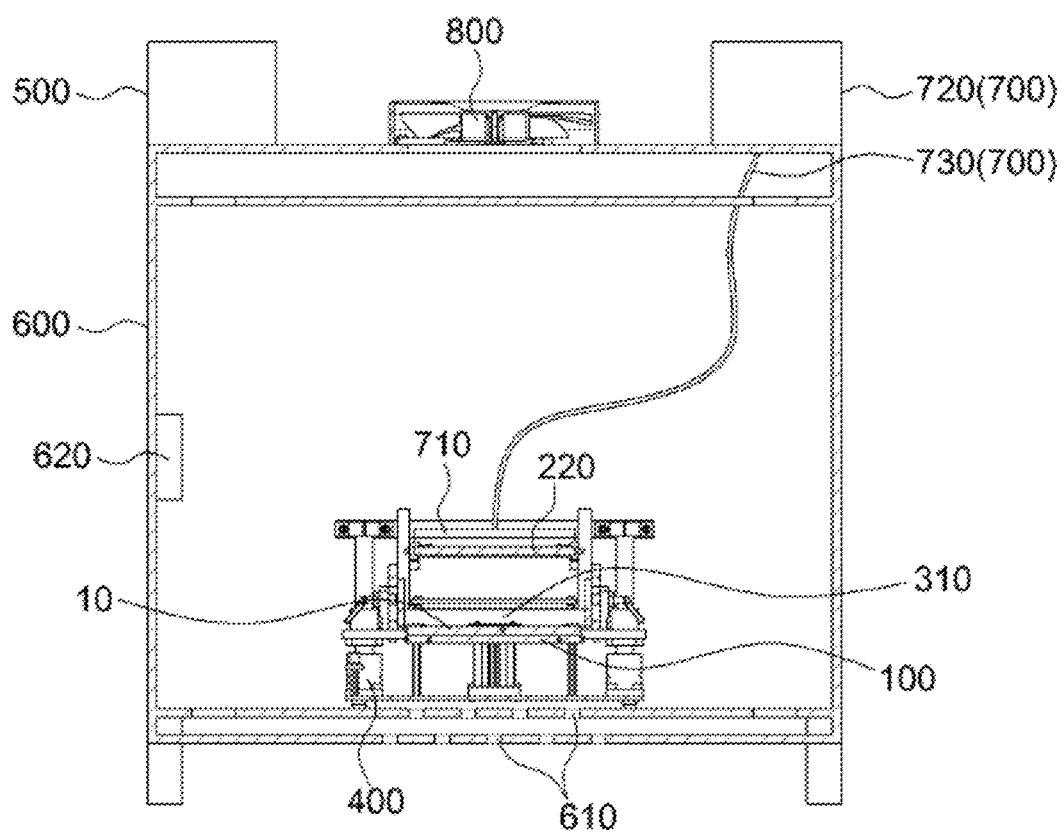
FIG. 8 is a front cross-sectional view when the LED array unit that has been rotated is positioned close to the solar battery cell in the apparatus for reduction of light induced degradation according to an embodiment of the present invention.
Figure 9:
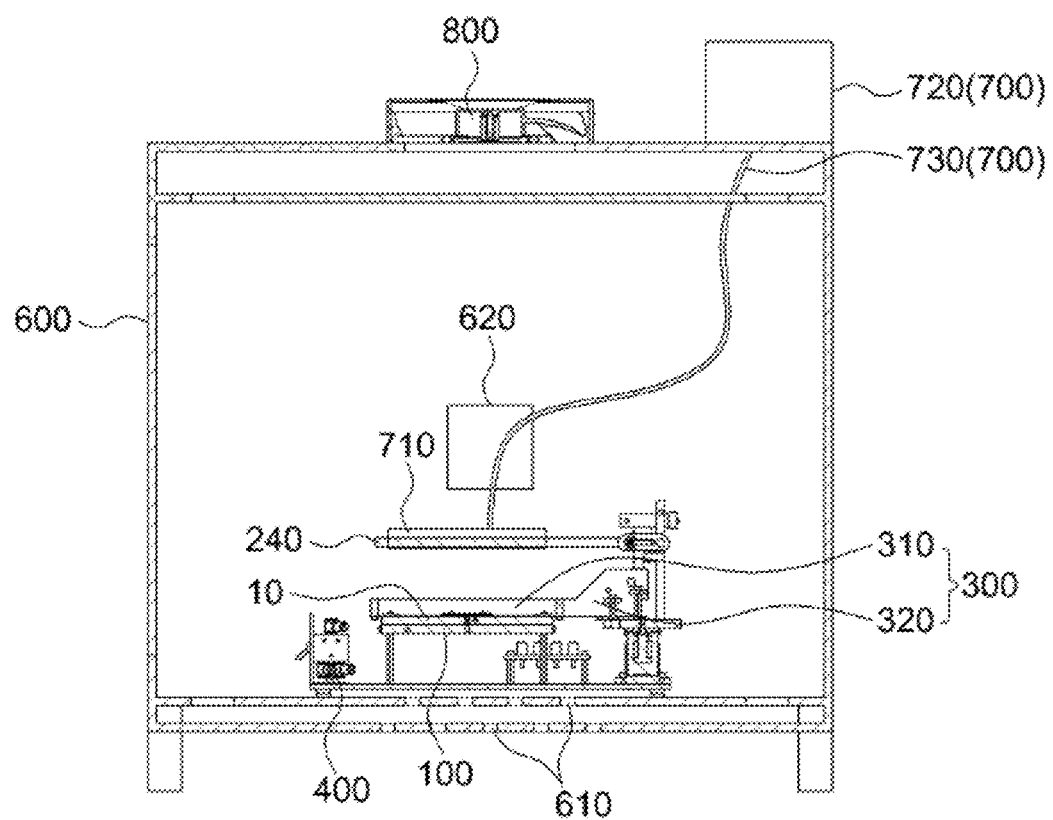
FIG. 9 is a side cross-sectional view when the LED array unit that has been rotated is positioned close to the solar battery cell in the apparatus for reduction of light induced degradation according to an embodiment of the present invention.

FIG. 8 is a front cross-sectional view when the LED array unit 200 that has been rotated is positioned close to the solar battery cell 10 in the apparatus for reduction of light induced degradation according to an embodiment of the present invention and FIG. 9 is a side cross-sectional view when the LED array unit 200 that has been rotated is positioned close to the solar battery cell 10 in the apparatus for reduction of light induced degradation according to an embodiment of the present invention.

As shown in FIGS. 1 to 9, the apparatus for reduction of light induced degradation of the present invention includes: a housing 600 in which high-temperature heat treatment is performed on a solar battery cell 10; a heating unit 100 that is formed in the housing 600, on which the solar battery cell 10 is seated, and that heats the solar battery cell 10; a jig unit 300 that is formed in the housing 600 and fixes the solar battery cell 10 to the heating unit 100 by pressing the solar battery cell 10 seated on the heating unit 100; an LED array unit 200 that has a plurality of LED light sources 210 and radiates light to the solar battery cell 10; and a driving unit 400 that is coupled to the jig unit 300 and the LED array unit 200 and rotates the jig unit 300 or the LED array unit 200.

In order to remove light induced degradation of the solar battery cell 10, the solar battery cell 10 should be blocked against influence by an external light source, so the housing may be a darkbox.

Since the apparatus for reduction of light induced degradation of the present invention uses the LED light sources, as described above, it may have a light radiation structure in which the light sources are small in size and the way of applying power is simple. Further, since the LED light sources 210 are used, it is possible to make irradiance uniform by controlling power that is applied, and the irradiance can be easily changed into 0.1-1.4 SUN.

A housing temperature sensor 620 that measures the temperature of the solar battery cell 10 may be formed in the housing 600. The housing temperature sensor 620 may be formed on the inner side of the housing 600, but is not limited thereto. Further, the housing temperature sensor 620 can measure the temperature of the solar battery cell 10 in a non-contact manner. By using the principle of measuring the temperature of a solar battery in a non-contact manner, as described above, a rapid temperature change of the solar battery cell 10 due to high thermal conductivity is detected in real time without physical damage to the surface of the solar battery cell 10. Accordingly, the solar battery cell 10 can be maintained within the range of 80~130° C. with an error within ±0.1° C. for 15 days.

The driving unit 400 can move straight up and down the jig unit 300 or the LED array unit 200. Further, as shown in FIGS. 2 to 9, the LED array unit 200 may include an LED array base 220 in which the LED arrays 210 are installed and arrayed, and a base connector 230 having an end coupled to an LED array main body and the other end coupled to the driving unit 400 to rotate. Further, the jig unit 300 may include a frame 310 that presses the solar battery cell 10 while being in contact with the solar battery cell 10, and a frame connector 320 that has an end coupled to the frame 310 and the other end coupled to the driving unit 400 to rotate.

As shown in FIGS. 8 and 9, when the base connector 230 coupled to the driving unit 400 is rotated, the LED array unit 200 is rotated, so the LED light sources 210 installed in the LED array base 220 can be moved close to or away from the solar battery cell 10. Further, since the LED array unit 200 is moved straight up and down by the driving unit 400, the vertical distance between the LED array unit 200 and the solar battery cell 10 can be adjusted after the LED light sources 210 are moved close to the solar battery cell 10.

Further, when the frame connector 320 coupled to the driving unit 400 is rotated, the jig unit 300 is rotated, so the frame 310 can be moved close to or away from the solar battery cell 10 seated on the heating unit 100. Further, when the jig unit 300 is moved straight up and down by the driving unit 400, the frame 310 comes in contact with the solar battery cell 10 and the solar battery cell 10 can be stably fixed to the heating unit 100, or the frame 310 is separated from the solar battery cell 10 and the solar battery cell 10 can be moved.

The heating unit 100 has a heating line therein that heats the solar battery cell 10, and at least one vacuum suction hole may be formed at a portion of the top of the heating unit 100 except for the installation path of the heating line. Further, when the bottom of the solar battery cell 10 comes in contact with the top of the heating unit 100, vacuum suction is performed by the vacuum suction hole so the solar battery cell 10 can be stably seated on the heating unit 100.

The apparatus for reduction of light induced degradation of the present invention may further include a power unit 500 that applies a voltage to the solar battery cell 10, measures voltage reactivity of the solar battery cell 10, and supplies power to the LED light sources 210. Accordingly, it is possible to check in real time a light induced degradation removal process through precise carrier injection. Further, it is possible to apply a light induced degradation removal characteristic in various ways by adjusting a condition such that an excessive energy state is not reached by adjusting a carrier injection size to 0.1-1.0 A.

The jig unit 300 may have a bus bar electrode which is an electrode that comes in contact with the top of the solar battery cell 10, and the heating unit 100 may have a bottom contact electrode which is an electrode that comes in contact with the bottom of the solar battery cell 10. Further, the bus bar electrode and the bottom contact electrode are connected to the power unit 500, so a voltage can be applied to the solar battery cell 10 from the power unit 500. Further, when light is radiated to the solar battery cell 10 simultaneously from the LED light sources 210 and electricity is produced from the solar battery cell 10, a current is applied to the power unit 500 from the bus bar electrode and the bottom contact electrode, so the power unit 500 can measure the voltage reactivity of the solar battery cell 10.

The apparatus for reduction of light induced degradation of the present invention may further include an air circulator 800 that is coupled to the ceiling of the housing 600 and discharges air in the housing 600. Further, the housing 600 may have air holes 610 formed through the bottom of the housing 600 and providing channels for air that flows into the housing 600.

The solar battery cell 10 is continuously heated by the heating unit 100 in the housing 600 and light induced degradation removal is attempted through such a high-temperature heat treatment, so the internal temperature of the housing 600 can be continuously elevated. Accordingly, the internal temperature of the housing 600 may not be maintained to be constant, so the air circulator 800 coupled to the ceiling of the housing 600 may forcibly discharge the heated air in the housing 600 to the outside by performing a rotational motion.

In order to forcibly discharge upward the heated air in the housing 600, external air is injected into the housing 600 through a plurality of air holes 610 formed through the bottom of the housing 600. Further, the air holes 610 may be formed in a double-layered air circulation channel shape to block external light in the process of circulating the internal air after external air is injected. In detail, the bottom of the housing 600 has a double wall structure and the air holes 610 are formed at different positions through an upper wall and a lower wall of the double wall structure with respect to the center of the walls, whereby paths of external light that may enter the housing 600 can be blocked.

The apparatus for reduction of light induced degradation of the present invention may further include a cooling unit 700 that is connected with the LED array unit 200 and cools the LED array unit 200 in a water-cooling manner. The cooling unit 700 may include a cooling pad 710 that is formed on a surface of the LED array base 220 on which the LED light sources 210 are not installed in the LED array unit 200 and that has a pad shape in which cooling water flows. Further, the cooling unit 700 may include a cooling pump 720 that supplies cooling water to the cooling pad 710, and a cooling water tube 730 that has an end coupled to the coupling pump 720 and the other end coupled to the cooling pad 710 to supply a channel for cooling water that flows between the cooling pump 720 and the cooling pad 710. An LED array temperature sensor 240 that measures the temperature of the LED light sources 210 is formed in the LED array unit 200, and the power unit 500 can control a cooling speed of the LED light sources 210 by controlling power that is applied to the cooling pump 720, using temperature information of the LED light sources 210 that is transmitted from the LED array temperature sensor 240.

Figure 10:
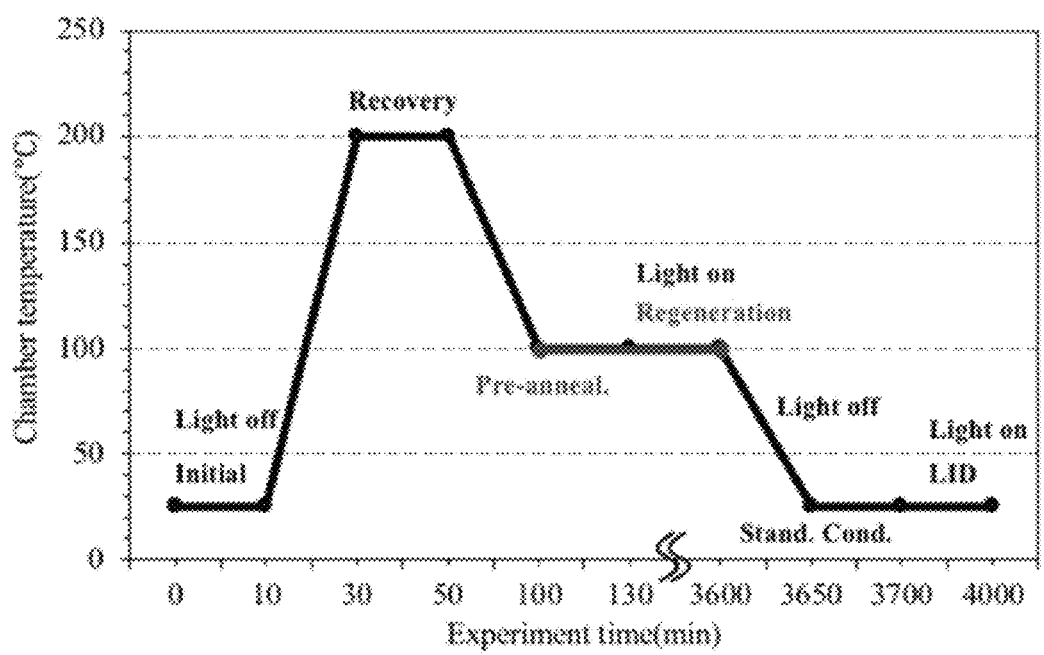
FIG. 10 is a graph showing a temperature change in each step of a method of reduction of light induced degradation according to an embodiment of the present invention.

Hereafter, a method of reduction of light induced degradation with carrier injection is described. FIG. 10 is a graph showing a temperature change in each step of a method of reduction of light induced degradation according to an embodiment of the present invention.

In a first step, the jig 300 is rotated and the solar battery cell 10 seated on the heating unit 100 can be fixed. The first step is an initial state, in which the LED light sources 210 have stopped radiating light to the solar battery cell 10, and as shown in FIGS. 2 and 3, the LED light sources 210 may be positioned away from the solar battery cell 10.

In a second step, a heat treatment may be applied to the solar battery cell 10 by heating by the heating unit 100 to remove light induced degradation of the solar battery cell 10. Since light induced degradation has been generated partially in the p-type solar battery cell 10 due to visible light entering in the process of manufacturing the solar battery cell 10, in order to remove the light induced degradation, a recovery process that completely removes the light induced degradation generated in the solar battery cell 10 by applying a heat treatment to the solar battery cell 10 at 150 to 250° C. for 5 to 15 minutes in a dark state may be performed.

In a third step, in order to perform a regeneration process for the solar battery cell 10, pre-annealing can be applied to the solar battery cell 10 by heating by the heating unit 100, and light can be radiated to the solar battery cell 10 by the LED light sources 210. The solar battery cell 10 is maintained at pre-annealing temperature for over 20 minutes within a target temperature range (80 to 150° C.) for performing the regeneration process for removing light induced degradation of the solar battery cell 10 after the recovery process in the second step, whereby temperature stability of the solar battery cell 10 can be secured. Further, light can be radiated to the solar battery cell 10 in the regeneration process.

In a fourth step, light radiation to the solar battery cell 10 by the LED light sources 210 is stopped and a voltage is applied to the solar battery cell 10, whereby carrier injection can be performed on the solar battery cell 10. After checking that the temperature of the solar battery cell 10 is stabilized at a predetermined target value after pre-annealing in the third step, the power unit 500 can start carrier injection and simultaneously can start to record the voltage output of the solar battery cell 10 in real time.

Thereafter, the light induced degradation removal process is performed for up to several hours to tens of hours, depending on the exposure temperature of the solar battery cell 10 and the carrier injection condition, carrier injection is stopped when the light induced degradation removal process is saturated, and the solar battery cell 10 is rapidly cooled to the room temperature (20 to 30° C.), thereby being able to finish the light induced degradation removal process.

In a fifth step, light is radiated to the solar battery cell 10 from the LED light sources 210 and it is possible to check whether light induced degradation has been removed from the solar battery cell 10. In detail, after checking that the temperature of the solar battery cell 10 is stabilized after reaching the room temperature, it is possible to check whether light induced degradation has been removed through carrier injection.

[Exemplary Experiment]

A p-type crystalline silicon solar battery cell 10 having a full BSF structure (having a thickness of 200 μm or less) was prepared. Further, a heat treatment was applied to the solar battery cell 10 by heating the solar battery cell 10 at 200° C. for 10 minutes using the heating unit 100 in the housing 600. When a heat treatment was applied to the solar battery cell 10, light was radiated to the solar battery cell 10 by the LED light sources 210. Thereafter, pre-annealing was applied to the solar battery cell 10 by heating the solar battery cell 10 at 130° C. for 30 minutes with the temperature of the heating unit 100 decreased. Next, carrier injection was performed on the solar battery cell 10 under a condition of 0.2 A using the power unit 500 (Source-Measure Unit; SMU). Further, the output voltage per unit time of the solar battery cell 10 was measured using the power unit 500.

Figure 11:
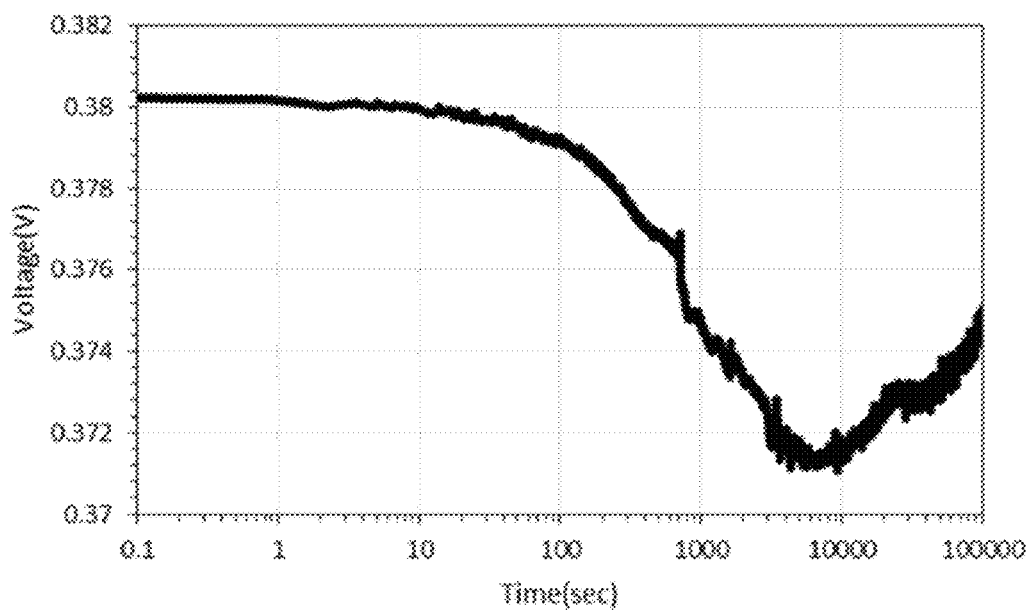
FIG. 11 is a graph showing an output voltage per unit time of a solar battery cell according to an embodiment of the present invention.
Figure 12:
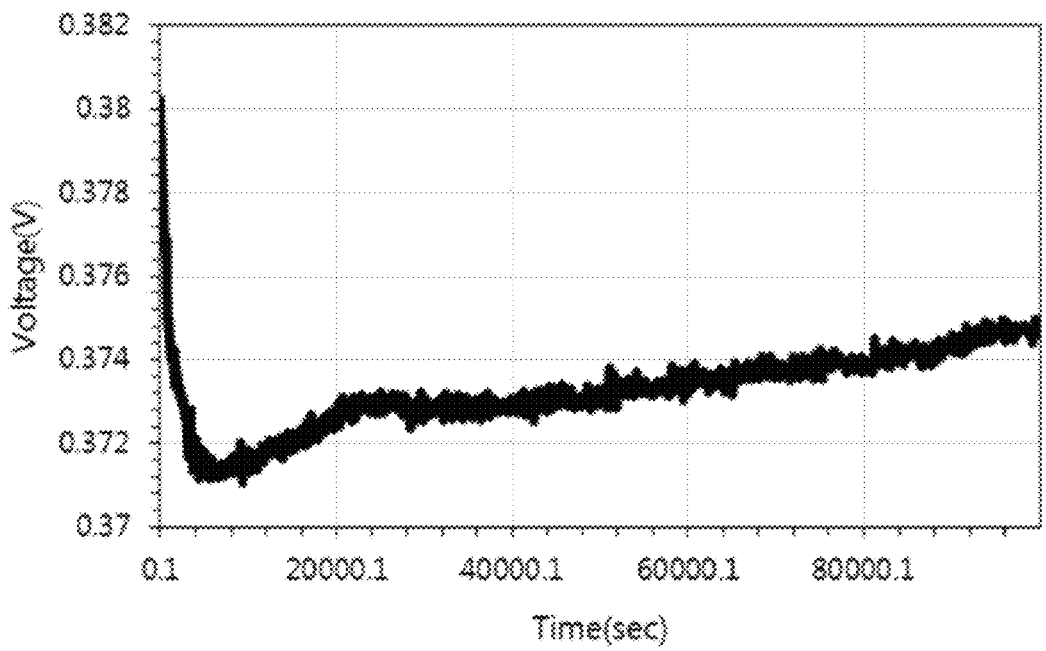
FIG. 12 is a graph showing an output voltage per unit time of a solar battery cell according to an embodiment of the present invention.

FIG. 11 is a graph showing an output voltage per unit time of the solar battery cell 10 according to an embodiment of the present invention, and FIG. 12 is a graph showing an output voltage per unit time of the solar battery cell 10 according to an embodiment of the present invention. In detail, FIG. 11 is a graph obtained by measuring the output voltage per unit time of the solar battery cell 10 according to [Exemplary Experiment] up to 100,000 seconds and FIG. 12 is a graph showing the output voltage per unit time of the solar battery cell 10 according to [Exemplary Experiment] at every 20,000 seconds.

As shown in FIGS. 11 and 12, it was found that the voltage of the solar battery cell 10 very gently decreased in the early stage and rapidly decreased after 100 sec. Further, it was found that the voltage was slowly recovered after 5000 sec and then the deterioration characteristic was recovered over a half after 10000 sec.

Figure 13:
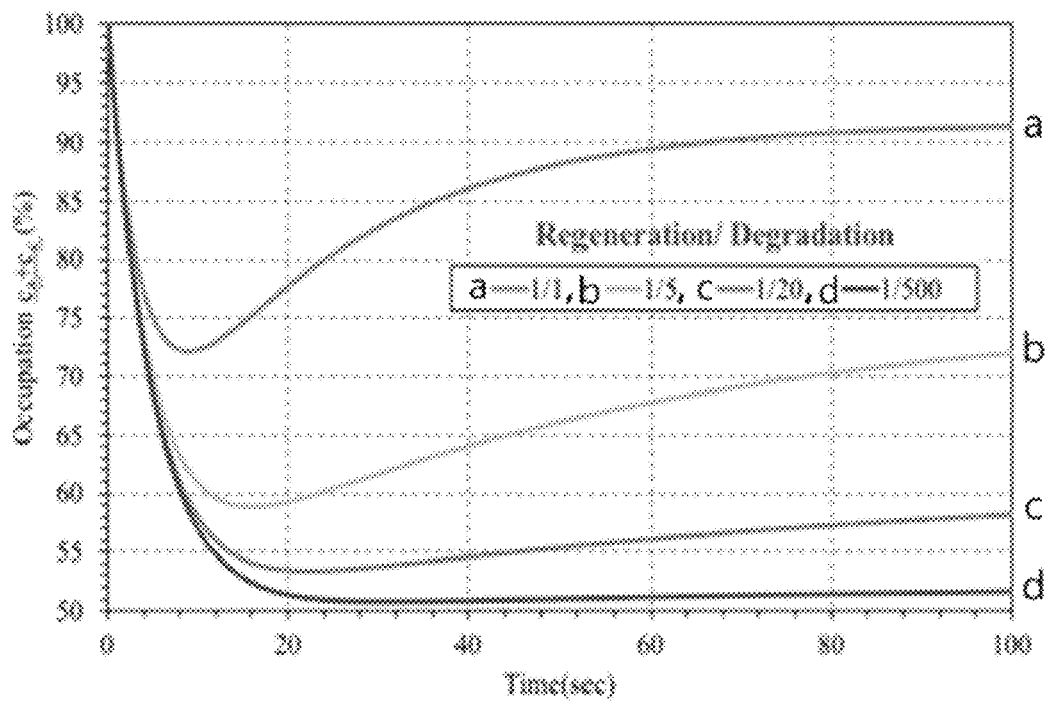
FIG. 13 is a graph showing the ratio of a light induced degradation generation process and regeneration process according to temperature.

FIG. 13 is a graph showing the ratio of a light induced degradation generation process and regeneration process according to temperature. In FIG. 13, the graph 'a' is the case of performing a heat treatment on the solar battery cell 10 at the highest temperature, as compared with the graphs 'b' to 'd', and is a graph when the ratio of the amount of light induced degradation and the amount of regeneration in the solar battery cell 10 was 1:1 (1/1). Further, in FIG. 13, the graph 'b' is the case of performing a heat treatment on the solar battery cell 10 at relatively high temperature, as compared with the graphs 'c' and 'd', and is a graph when the ratio of the amount of light induced degradation and the amount of regeneration in the solar battery cell 10 was 1:5 (1/5). Further, in FIG. 13, the graph 'c' is the case of performing a heat treatment on the solar battery cell 10 at relatively high temperature, as compared with the graph 'd', and is a graph when the ratio of the amount of light induced degradation and the amount of regeneration in the solar battery cell 10 was 1:20 (1/20). Further, in FIG. 13, the graph 'd' is the case of performing a heat treatment on the solar battery cell 10 at the lowest temperature, and is a graph when the ratio of the amount of light induced degradation and the amount of regeneration in the solar battery cell 10 was 1:500 (1/500).

As shown in FIG. 13, the ratio of the light induced degradation process and the regeneration process depends on temperature. Further, it was found that when the temperature of the solar battery cell 10 increased, the performance of the solar cell decreased and then increased again, as in the graph 'a' (1/1). Further, light induced degradation, in which, when the temperature became close to the room temperature, the performance of the solar battery cell 10 continuously decreased and was saturated, was found. Accordingly, it was found that it is possible to remove light induced degradation by applying a heat treatment to the solar battery cell 10 at relatively high temperature.

An effect of the present invention according to the configuration described above is that it is possible to check in real time a process of removing light induced degradation using precise carrier injection through an AC power supply device (power unit).

Further, an effect of the present invention is that since LED light sources are used, it has a light radiation structure in which the light sources are small in size and the way of applying power is simple.

Further, an effect of the present invention is that it is possible to check whether light induced degradation is actually generated again after light induced degradation is removed.

The effects of the present invention are not limited thereto and it should be understood that the effects include all effects that can be inferred from the configuration of the present invention described in the following specification or claims.

The above description is provided as an exemplary embodiment of the present invention and it should be understood that the present invention may be easily modified in other various ways without changing the spirit or the necessary features of the present invention by those skilled in the art. Therefore, the embodiments described above are only examples and should not be construed as being limitative in all respects. For example, the components described as single parts may be divided and the components described as separate parts may be integrated.

The scope of the present invention is defined by the following claims, and all of changes and modifications obtained from the meaning and range of claims and equivalent concepts should be construed as being included in the scope of the present invention.

What is claimed is:

1. An apparatus for reducing light induced degradation, the apparatus comprising:
    a housing in which heat treatment is performed on a solar battery cell;
    a heating assembly that is disposed in the housing and is configured to heat the solar battery cell, wherein the solar battery cell is seated on the heating assembly;
    a jig assembly that is disposed in the housing and fixes the solar battery cell to the heating assembly by pressing the solar battery cell seated on the heating assembly;
    an LED array assembly that has a plurality of LED light sources and is configured to radiate light to the solar battery cell; and
    a driving assembly that is coupled to the jig assembly and to the LED array assembly, and is configured to move the jig assembly or the LED array assembly,
    wherein the LED array assembly includes an LED array base on which the plurality of LED light sources are arrayed, and a base connector which is coupled to the LED array base and to the driving assembly and is configured to rotate.

2. The apparatus of claim 1, wherein the jig assembly includes a frame that presses the solar battery cell while being in contact with the solar battery cell, and a frame connector that is coupled to the frame and to the driving assembly and is configured to rotate.

3. The apparatus of claim 1, further comprising an air circulator that is coupled to a ceiling of the housing and is configured to discharge air in the housing.

4. The apparatus of claim 1, wherein the housing has air holes formed through a bottom of the housing and providing channels for air that flows into the housing.

5. An apparatus for reducing light induced degradation with carrier injection, the apparatus comprising:
    a housing in which heat treatment is performed on a solar battery cell;
    a heating assembly that is disposed in the housing and is configured to heat the solar battery cell, wherein the solar battery cell is seated on the heating assembly;
    a jig assembly that is disposed in the housing and fixes the solar battery cell to the heating assembly by pressing the solar battery cell seated on the heating assembly;
    an LED array assembly that has a plurality of LED light sources and is configured to radiate light to the solar battery cell;
    a driving assembly that is coupled to the jig assembly and to the LED array assembly, and is configured to move the jig assembly or the LED array assembly; and
    a power assembly that is configured to apply a voltage to the solar battery cell, measure voltage reactivity of the solar battery cell, and supply power to the LED light sources.

6. The apparatus of claim 1, wherein the jig assembly has a bus bar electrode which is in contact with a top of the solar battery cell, and the heating assembly has a bottom contact electrode which is in contact with a bottom of the solar battery.

7. The apparatus of claim 1, further comprising a cooling assembly that is connected with the LED array assembly and is configured to cool the LED array assembly in a water-cooling manner.

8. A method of reducing light induced degradation using an apparatus comprising a housing in which heat treatment is performed on a solar battery cell, a heating assembly that is disposed in the housing and is configured to heat the solar battery cell, wherein the solar battery cell is seated on the heating assembly, a jig assembly that is disposed in the housing and fixes the solar battery cell to the heating assembly by pressing the solar battery cell seated on the heating assembly, an LED array assembly that has a plurality of LED light sources and is configured to radiate light to the solar battery cell, a driving assembly that is coupled to the jig assembly and to the LED array assembly and is configured to move the jig assembly or the LED array assembly, the method comprising:
    applying the heat treatment to the solar battery cell by the heating assembly to remove the light induced degradation of the solar battery cell;
    applying pre-annealing to the solar battery cell by the heating assembly and radiating the light to the solar battery cell by the plurality of LED light sources in order to perform a regeneration process for the solar battery cell;
    stopping the light radiation to the solar battery cell and applying a voltage to the solar battery cell, wherein carrier injection is performed on the solar battery cell; and
    radiating again the light to the solar battery cell by the plurality of LED light sources and checking whether the light induced degradation has been removed from the solar battery cell.

* * * * *